United States Patent [19]
Myers

[11] Patent Number: 5,724,434
[45] Date of Patent: Mar. 3, 1998

[54] MAGNETORESISTIVE AUDIO LIMITER

[75] Inventor: Daniel C. Myers, St. Charles, Ill.

[73] Assignee: Thomas C. Hilbe, Cambria, Calif.

[21] Appl. No.: 744,398

[22] Filed: Nov. 7, 1996

Related U.S. Application Data

[60] Provisional application No. 60/006,369, Nov. 8, 1995.
[51] Int. Cl.$^6$ .................................................... H03G 3/00
[52] U.S. Cl. ................................................. 381/108; 381/104
[58] Field of Search .......................... 338/32 R; 381/104, 381/105, 106, 107, 108, 109

[56] References Cited

U.S. PATENT DOCUMENTS 4,406,923  9/1983  Burne, III et al. ................... 381/108
4,905,291  2/1990  Strickland ............................. 381/108
5,049,809  9/1991  Wakatsuki et al. ................... 338/32 R

*Primary Examiner*—Curtis Kuntz
*Assistant Examiner*—Vivian Chang
*Attorney, Agent, or Firm*—J. E. McTaggart

[57] ABSTRACT

A voltage controlled audio attenuator, of particular benefit in audio limiters, is created by configuring a nearly-balanced four-resistor bridge such that at least one of the branch resistors is implemented as a magnetoresistive element, located in a variable magnetic field, typically generated by a coil energized by current from an electronic driver which is made controllable from a DC control voltage, which is thus enabled to control the attenuation of the bridge. A suitable feedback processing circuit, receiving input from the bridge output and producing the DC control voltage in a predetermined dynamic relationship, forms the feedback branch of an automatic loop, thus the voltage-controlled attenuator is utilized as a key element of an audio limiter.

12 Claims, 1 Drawing Sheet

MAGNETORESISTIVE AUDIO LIMITER

Benefit of priority in this application is claimed from U.S. provisional patent application Ser. No. 60/006,369, filed on Nov. 8, 1995.

FIELD OF THE INVENTION

The present invention relates to the audio field and more particularly it relates to an audio limiter utilizing a magnetoresistive element in a voltage-controlled attenuation portion of an automatic level control system.

BACKGROUND OF THE INVENTION

Audio limiters require electrically-controlled gain/attenuation adjustment means. Such means, utilized in an automatic loop, must provide a required range with sufficient agility, i.e. fast response time, without introducing excessive distortion. Early technology utilizing the variable gain cutoff characteristic of a pentode vacuum tube introduced substantial distortion due to the inherent non-linearity on which the variable gain was based. Despite improvements in recent years, similar problems exist in modern solid state voltage controlled amplifiers.

In attempts to avoid such limitations, in an optical approach, photoconductive cells have been used as variable resistance elements to control gain, however there is a problem of speed: a cadmium sulphide cell may typically require 0.03 seconds to respond to incident light changes and much longer to recover its dark value. Selenium photoconductive cells are somewhat faster, responding to both dark and light in about 160 microseconds, but this may not be fast enough since it corresponds to a half cycle at 3125 Hz audio signal several octaves below the limit of human perception.

In the light of the above limitations I have employed in an audio limiter a variable attenuation element that operates on the principle of magnetoresistance, i.e. the change in electrical resistance produced in a current-carrying conductor or semiconductor on application of a magnetic field. Since the effect relies on the deflection of conduction electrons within a conductor it occurs as fast as the conductor can be permeated by the magnetic field, the inertia of the moving electrons being negligible.

The magnetoresistive effect has been known since 1858: a magnetic field increases the resistivity of all metals except iron, nickel and cobalt (the ferromagnetic metals) for which the resistivity decreases. The effect is generally quite small: a field of 200 kilogausses increases the resistivity of copper by 0.25%; however, for bismuth, a comparatively enormous effect is observed so much so that the resistivity of thin spirals of bismuth wire is used for measuring magnetic fields.

This magnetoresistive effect is to be distinguished from Hall effect which is the development of transverse electric field in a current-carrying conductor placed in a magnetic field, ordinarily positioned so that the magnetic field is perpendicular to the direction of current flow and the electric field is perpendicular to both.

DISCUSSION OF RELATED KNOWN ART

The magnetoresistive effect has been utilized to provide manually-variable non-contact potentiometers as exemplified in U.S. Pat. Nos. 3,676,819 to Keller, 3,691,502 to Kataoka, 3,988,710 to Sedor et al, 4,132,970 top Masuda, 4,423,406 to Nakano and 4,835,509 to Yashino et al.

OBJECTS OF THE INVENTION

It is a primary object of the present invention to provide a voltage-controlled audio attenuator utilizing a magnetoresistive device as a key operational element.

It is a further object to provide an audio limiter utilizing a magnetoresistive device as a key operational element in a voltage-controlled attenuator portion of an automatic level control loop.

SUMMARY OF THE INVENTION

The abovementioned objects have been accomplished by the present invention of an audio limiter utilizing a magnetoresistive device located in a variable magnetic field as a branch of a slightly unbalanced bridge to accomplish voltage-controlled variable attenuation in an automatic level control loop in the audio limiter.

BRIEF DESCRIPTION OF THE DRAWINGS

The above and further objects, features and advantages of the present invention will be more fully understood from the following description taken with the accompanying drawings in which.

DETAILED DESCRIPTION

Figure 1:
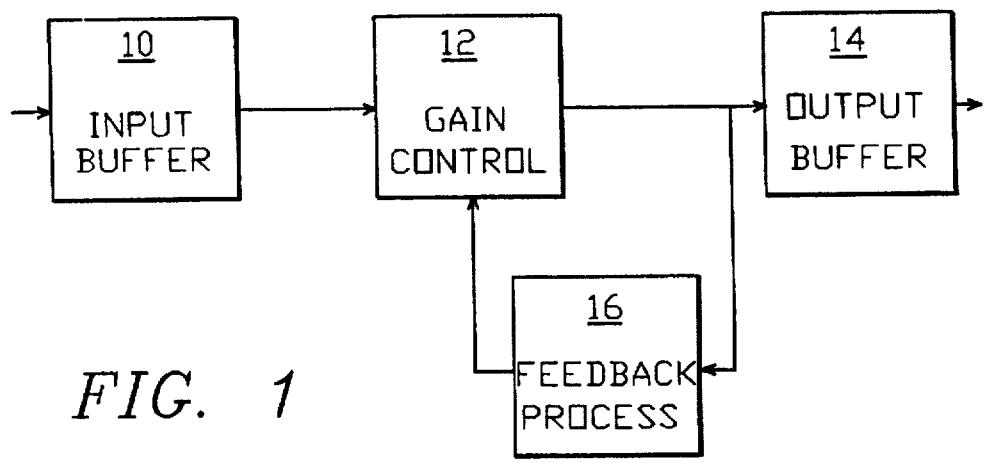
FIG. 1 is a functional block diagram of the general arrangement of a feedback audio limiter or ALC (automatic level control) loop.

In FIG. 1 the general arrangement of a feedback audio limiter utilizing an ALC (automatic level control) loop is illustrated. An audio input signal is applied, via an input buffer 10 to gain control circuit 12 whose output is applied both to an output buffer 14 and to a feedback processor 16 which acts to control block 12 in a manner that tends to maintain a relatively constant audio level at the input and output of buffer 14 despite variations in the level of the input signal applied to input buffer 10 above a predetermined threshold.

Input buffer 10 and output buffer 14 are implemented in a well known manner and may include amplification, preferably utilizing operational amplifiers in a differential mode to suppress common mode interference.

Figure 2:
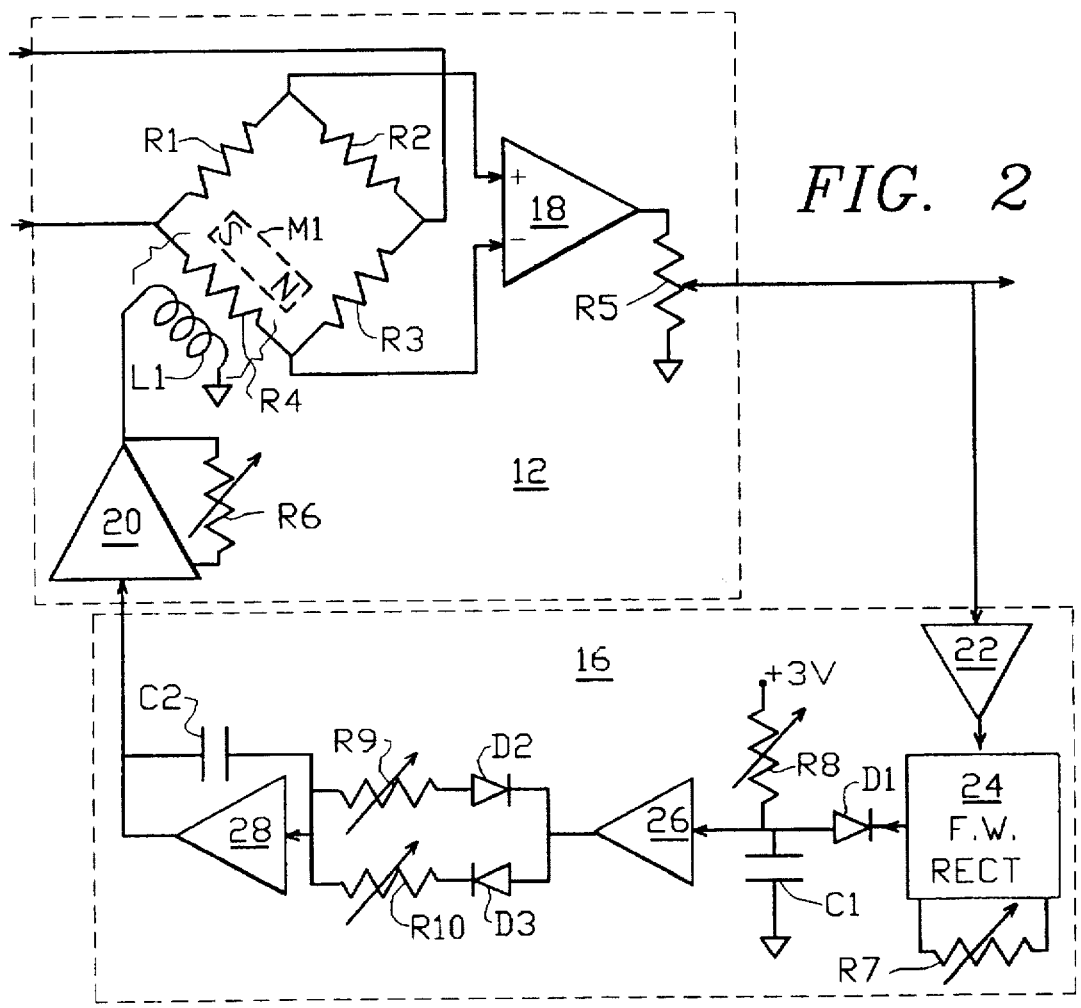
FIG. 2 is a functional schematic diagram of the gain control and feedback process blocks of FIG. 1 as implemented in an illustrative embodiment of a magnetoresistive audio limiter of the present invention.

FIG. 2 is a functional schematic diagram of an automatic level control circuit of the present invention for implementing the gain control block 12, including a magnetoresistive element, and the feedback process block 16 of FIG. 1. A bridge circuit is formed from resistors R1, R2, R3 and R4 of which at least one is made a magnetoresistive element, e.g. R4. The bridge can be balanced by making bridge resistor values satisfy the equation R1/R2=R4/R3, e.g. making all four resistors of equal value. The differential input audio signal from block 10 is applied as input to the bridge at junctions R1/R4 and R2/R3. The differential audio output signal from junctions R1/R2 and R3/R4 of the bridge is applied to the differential inputs of op-amp 18, whose output is applied to a manual gain potentiometer R5, providing the output from block 12.

The output from block 12 is applied via a buffer 22 to a precision full wave rectifier 24 with peaking adjustment rheostat R7, thence via diode D1 to an envelope filter formed by capacitor C1 and rheostat R8 connected to +3 volts. The negative-going envelope, referenced to +3 volts, is applied via buffer 26 and via the dual paths, diode D2 plus rheostat R9 and diode D3 plus rheostat R10, to the input of op-amp 28 which forms a slope generator due to integrating action of capacitor C2 in the feedback path. The output of slope generator op-amp 28 provides the control voltage that is applied to op-amp coil driver 20 as input to gain control block 12.

For input levels below the threshold level the limiter is made to operate with a fixed maximum gain in block 12. When the input level increases to where it exceeds the threshold level, coil driver 20 is caused to control the current in coil L1 in a manner to reduce the gain of block 12 accordingly by varying the degree of bridge unbalance due to the magnetoresistive effect on the bridge as a function of a control voltage generated by block 16 and applied to the input of the coil driver 20.

The two circuit branches with diodes D2 and D3 control the rate of rise and fall of the control voltage respectively so that by adjusting R8, R9 and R10 to appropriate values, the attack and release can be set independently to different values to achieve a subjectively desirable overall dynamic control action that minimizes audible distortion under variable field conditions. Rheostat R8 can be made to vary in proportion with the setting of R10 (attack) so the time constant of the envelope filter maintains a proportionality to the rising slope of the control voltage from the slope generator op-amp 28. This arrangement preserves the capability of rapid action at minimum settings of R9 and R10 while preventing interaction of these controls as R10 is increased.

In a first embodiment of the invention, the bridge is implemented by a magnetic field sensor bridge device, commercially available from Philips Semiconductors as type KMZ10B, wherein four identical resistors are formed from a magnetoresistive thin film permalloy. The Philips bridge is supplied initially balanced in the absence of a magnetic field, and has a bridge resistance of 2,000 ohms nominal. In the first embodiment, bridge unbalance is introduced by exposing the magnetoresistive bridge to a magnetic field that has a gradient affecting the bridge branches differently. An initial unbalance is introduced from a permanent magnet Mi, shown in dashed outline, positioned to provide a predetermined balance offset. The circuitry in feedback block 16 is arranged to hold off application of current to coil L1 as long as the input signal level remains below the threshold, so that the balance offset from the magnet causes block 12 to operate at a designated maximum working gain.

Whenever the signal level increases to beyond the threshold, the feedback block 16 becomes activated to bias driver 20 to apply current to coil L1 in a direction that opposes the effect of magnet M1, shifting the bridge towards balance and thus decreasing the gain of block 14 sufficiently to maintain substantially constant audio level in the output buffer 14. With further increase of input level the balance would shift further and more closely approach the balanced condition which reduces gain strongly. The working range of block 12 gain variation is controlled by setting rheostat R6 which varies the gain of coil driver 20 and the limit of maximum current available to coil L1.

The system could be arranged to operate in an opposite mode with regard to current change in coil L1, where the current would be maximum for input levels below the threshold, and caused to reduce toward zero with increasing input level. However this mode is generally less efficient due to much greater overall current requirement of coil L1.

In a second embodiment, only one of the resistors, R4 in this example is made magnetoresistive: it can be located in a uniform magnetic field, as indicated in FIG. 2, since the above mentioned magnetic field gradient is not required. The required initial bridge balance offset can be obtained by adjusting any of the other three bridge resistors so that magnet M1 would not be required.

In the bridge circuit of gain control block 12, the invention may be practiced with one, two, three or all four bridge resistors (R1, R2, R3, R4) implemented by magnetoresistive elements, with appropriate application of the magnetic field as described above. With two magnetoresistive elements it is beneficial to place them at opposite arms of the bridge, e.g. R1 and R3, or R2 and R4. The magnetoresistive element(s) may be located within the coil L1 or alternatively in an air gap of a ferromagnetic core energized by the coil L1.

The principle taught by this invention, i.e. accomplishing gain control by magnetic influence on a magnetoresistive element in one or more arms of an offset-balanced bridge, can be applied to many voltage-controlled gain applications in addition to audio limiters as described above, and is particularly beneficial as readily applicable to automatic dynamic audio processors such as compressors, expanders and the like.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. An electrically-controlled variable gain cell comprising:
   a bridge circuit having four arms connected in series in a loop such as to provide four nodes, of which a first diagonally opposite pair is made to receive an audio frequency bridge input signal whereby, under an unbalanced bridge condition, a second diagonally opposite pair of nodes provides a bridge output signal constituting an attenuated replica of the bridge input signal;
   three resistors constituting respectively three of the four arms of said bridge circuit;
   a magnetoresistive element constituting the fourth of the four arms of said bridge circuit; and
   an electrically-controlled magnetic source constructed and arranged to provide a variable-strength magnetic field engaging said magnetoresistive element;
   said resistors and said magnetostrictive element being made to have resistive values such that said bridge circuit is slightly unbalanced to the extent of a predetermined offset, whereby said bridge circuit may be controlled with regard to attenuation, defined as amplitude of the bridge output signal divided by amplitude of the bridge input signal, by electrically controlling said magnetic source so as to vary the magnetic field engaging said magnetoresistive element.

2. The electrically-controlled variable gain cell as defined in claim 1 wherein said electrically-controlled magnetic source comprises an inductive winding constructed and arranged and arranged to provide the magnetic field applied to said magnetostrictive element in response to application of a direct current through said inductive winding, the applied magnetic field, and thusly the bridge attenuation, being controllable according to amplitude of the direct current.

3. The electrically-controlled variable gain cell as defined in claim 2 wherein said electrically-controlled magnetic source further comprises a magnetic core having an air gap and said magnetoresistive element is located within the air gap.

4. The electrically-controlled variable gain cell as defined in claim 2 wherein said electrically-controlled magnetic source further comprises an electronic current drive amplifier, receiving as input a DC control voltage, constructed and arranged to provide as output the direct current in said inductive winding controllable in amplitude by the DC control voltage, whereby the applied magnetic field, and hence the bridge attenuation, are made to be controlled by the DC control voltage.

5. The electrically-controlled variable gain cell as defined in claim 4 further comprising, in said current drive amplifier, adjustment means constructed and arranged to provide adjustment of sensitivity defined as the relationship between output current and DC control voltage.

6. The electrically-controlled variable gain cell as defined in claim 4 further comprising an electronic operational amplifier, receiving as input the bridge output signal, constructed and arranged to provide as output a buffered bridge output signal constituting a scaled replica of the bridge input signal.

7. The electrically-controlled variable gain cell as defined in claim 6 further comprising gain adjustment means constructed and arranged to allow gain adjustment of said operational amplifier.

8. The electrically-controlled variable gain cell as defined in claim 6, incorporated in a closed-loop automatic limiter circuits connected to a feedback branch comprising:

a feedback branch input port receiving as input the buffered bridge output signal;

a feedback branch output port providing as feedback branch output the DC control voltage input to said electronic current drive amplifier; and a feedback processing circuit, connected between said input port and said output port, constructed and arranged to interact with said gain cell in a manner to perform dynamic audio limiting of the buffered bridge output signal.

9. The electrically-controlled variable gain cell as defined in claim 8 wherein said feedback processing circuit comprises:

an input buffer amplifier receiving as input the buffered bridge output signal;

a full wave rectifier receiving as input a replica of the bridge output signal from said input buffer and providing as output a full wave rectified signal derived from the input;

an envelope filter circuit receiving as input the full wave rectified signal via a diode coupling element, providing as output a smoothed rectified signal;

a filter buffer amplifier constructed and arranged to provide an adjustably biased input threshold level, receiving as input the smoothed rectified signal and providing as output a thusly processed negative feedback signal;

a slope generator operational amplifier having an input receiving the processed negative feedback signal via a dual diode-resistor network, said slope generator being constructed and arranged to provide the DC control voltage to the current drive amplifier.

10. An audio limiter circuit comprising:

a four node, four branch resistive bridge circuit constructed and arranged to receive an audio input signal at a first pair of diagonally opposite nodes and to provide an attenuated audio output signal at a second pair of diagonally opposite nodes;

a magnetoresistive element forming one branch of said bridge circuit;

an electromagnetic element constructed and arranged to provide a magnetic field encompassing said magnetoresistive element;

an electronic control circuit constructed and arranged to control the magnetic field in amplitude in response to a DC control voltage;

a feedback processing circuit, receiving as input the bridge output signal, constructed and arranged to provide the DC control voltage in predetermined relation to amplitude of the bridge signal, and to thus act as a feedback branch of an automatic loop to provide predetermined audio limiting action.

11. An electromagnetic method of voltage-controlling audio attenuation comprising the steps of:

applying an input audio signal to a pair of diagonally opposite nodes of a four branch resistive bridge so as to derive an attenuated output signal at a second pair of diagonally opposite nodes;

providing, as one branch of the bridge, a magnetoresistive element;

exposing the magnetoresistive element to a magnetic field from an electromagnetic element;

adjusting one or more branches of the bridge so as to obtain a predetermined audio attenuation of the output signal relative to the input audio signal, as established by partial unbalance of the bridge; and controlling the magnetic field in intensity by current driver means responsive to a DC control voltage, whereby the audio attenuation can be varied proportionally by the DC control voltage.

12. The electromagnetic method of voltage-controlling audio attenuation as defined in claim 11 comprising the further step of providing, as one or more additional ones of the four branches of the bridge, a corresponding number of additional magnetoresistive elements each subjected to a magnetic field that is made to vary in a manner and polarity to increase the operational sensitivity defined as audio attenuation vs DC control voltage.

* * * * *